United States Patent [19]

Moskovits et al.

[11] Patent Number: 5,614,258
[45] Date of Patent: Mar. 25, 1997

[54] PROCESS OF DIAMOND GROWTH FROM $C_{70}$

[75] Inventors: Martin Moskovits, 145 Chiltern Hill Rd., Toronto, Ontario, Canada, M6C 3C3; Kejian Fu, Toronto; Xijia Gu, North York, both of Canada

[73] Assignee: Martin Moskovits, Toronto, Canada

[21] Appl. No.: 391,705

[22] Filed: Feb. 21, 1995

[51] Int. Cl.$^6$ ................................................ B01J 3/06
[52] U.S. Cl. ........................................ 427/249; 423/446
[58] Field of Search ........................... 423/446; 427/249

[56] References Cited

U.S. PATENT DOCUMENTS

| | | | |
|---|---|---|---|
| 5,209,916 | 5/1993 | Gruen | 423/446 |
| 5,328,676 | 7/1994 | Gruen | 423/446 |
| 5,370,855 | 12/1994 | Gruen | 423/446 |
| 5,462,776 | 10/1995 | Gruen | 423/446 |

FOREIGN PATENT DOCUMENTS

| | | |
|---|---|---|
| 9311068 | 6/1993 | WIPO . |
| 9421557 | 9/1994 | WIPO . |

OTHER PUBLICATIONS

Crushing $C_{60}$ to Diamond at Room Temperature Manuel Nunez Regueiro et al. *Nature* vol. 355, pp. 237–239, 16 Jan. 1992.

Diamond from Fullerenes: Evidence from Raman Measurements M. Nunez Regueiro et al. *Physical Review B* vol. 46, No. 15, pp. 9903–9905, 15 Oct. 1992.

Quenching a Transition of $C_{60}$ Fullerene to Diamond Under Shock Compression Hisako Hirai, et al. *Carbon* vol. 3, No. 7, pp. 1095–1098, 11 Jan. 1993.

Nucleation of Diamond Films on Surfaces Using Carbon Clusters R. J. Meilunas et al. *Applied Physics Letters* vol. 59, pp. 3461–3463 23 Dec. 1991.

Activated $C_{70}$ and Diamond R. J. Meilunas et al. *Nature* vol. 354, p. 271, 28 Nov. 1991.

Buckyball Microwave Plasmas: Fragmentation and Diamond–Film Growth Dieter M. Gruen et al. *J. Appl. Phys.* vol. 75, No. 3, pp. 1758–1763, 1994.

Fullerenes as Precursors for Diamond Film Growth without Hydrogen or Oxygen Additions Dieter M. Gruen et al. *Appl. Phys. Lett.* vol. 64, No. 12, pp. 1502–1504, 21 Mar. 1994.

Effect of Explosion Conditions on the Structure of Detonation Soots: Ultradisperse Diamond and Onion Carbon V. L. Kuznetsov et al. *Carbon* vol. 32, No. 5, pp. 873–882, 1 Nov. 1993.

Onion–Like Carbon from Ultra–Disperse Diamond V. L. Kuznetsov et al. *Chemical Physics Letters* vol. 222, pp. 343–348, 20 May 1994.

Carbon Fibers Based on $C_{60}$ and their Symmetry M. S. Dresselhaus et al. *Physical Review B.* vol. 45, No. 11, pp. 6234–6237, 24 Sep. 1991.

Role of $sp^3$ Carbon and 7–Membered Rings in Fullerene Annealing and Fragmentation Robert L. Murry et al. *Nature* vol. 366, pp. 665–667, 16 Dec. 1993.

Vibrational Mode Frequencies in $C_{70}$ R. A. Jishi et al. *Chemical Physics Letters* vol. 206, No. 1, 2, 3, 4, pp. 187–191, 30 Apr. 1993.

*Primary Examiner*—Michael Lewis
*Assistant Examiner*—Stuart L. Hendrickson
*Attorney, Agent, or Firm*—Hill & Schumacher; Lynn C. Schumacher

[57] ABSTRACT

A method of growing diamond crystals in excess of 10 μm in diameter from industrial diamond "seeds" having mean diameters of approximately 1.5 μm is disclosed. The diamonds are grown by exposing the seed diamonds to $C_{70}$ in the presence of reducing agents such as phosphorus or selenium in evacuated cells at moderate temperatures and pressures.

13 Claims, 7 Drawing Sheets

PROCESS OF DIAMOND GROWTH FROM $C_{70}$

FIELD OF THE INVENTION

The present invention relates to a method of growing diamonds by reduction of $C_{70}$ Buckminster fullerenes in the presence of diamond seed particles.

BACKGROUND OF THE INVENTION

Diamond, being the hardest substance known, is of great commercial and scientific value. It is inert to chemical corrosion and can withstand compressive forces and radiation. It is an electrical insulator having extremely high electrical resistance but is an excellent thermal conductor, conducting heat better than most other electrical insulators. Diamond is structurally similar to silicon but is a wide-bandgap semiconductor (5 eV) and so is transparent to UV-visible light and to much of the infrared spectrum. It has an unusually high breakdown voltage and low dielectric constant. These properties, coupled with recent advances, have led to speculation that diamond might find widespread application in high speed electronic devices and devices designed to be operated at high temperature. If it can be doped successfully diamond could become an important semiconductor material on which new or replacement device applications may be based. While silicon chips can withstand temperatures up to 300° C., it is estimated that diamond devices may be able to withstand considerably higher temperatures. Diamond film already find applications as hard protective coatings.

Because of these useful properties, synthetic diamond has great potential in research and commercial applications. Synthetic diamonds are now produced by two known methods: a high pressure process in which carbonaceous material is compressed into diamond using high pressure anvils; and the more recent technique of chemical vapour deposition (CVD) in which diamond films are deposited on an appropriate substrate by decomposing a carbon containing gaseous precursor.

Of recent particular scientific interest are a class of carbon structures known as Buckminster fullerenes which are formed by an integral number of carbon atoms which combine to form a closed, roughly spherical structure. Two prominent fullerenes are $C_{60}$ and $C_{70}$, which are spherical structures comprising 60 and 70 carbon atoms, respectively. The successful transformation of $C_{60}$ and $C_{70}$ into diamond at high pressure has been disclosed by Manuel Nunez Regueiro, Pierre Monceau, Jean-Louis Hodeau, *Nature*, 355, 237–239 (1992) and Manuel Nunez Regueiro, L. Abello, G. Lucazeau, J. L. Hodeau, *Phys. Rev. B*, 46, 9903–9905 (1992). The transition of $C_{60}$ to diamond has also been studied by Hisako Hirai, Ken-ichi Kondo and Takeshi Ohwada, *Carbon*, 31, 1095–1098 (1993). It is also known that $C_{70}$ can accelerate the nucleation of diamond thin film formation on metal surfaces using CVD as disclosed by R. J. Meilunas, R. P. H. Chang, S. Liu, M. M. Kappes, *Appl. Phys. Lett.*, 59, 3461–3463 (1991), and R. J. Meilunas, R. P. H. Chang, S. Liu, M. M. Kappes, *Nature*, 354, 271 (1991).

A high growth rate of diamond film using fullerene precursors in an argon microwave plasma with or without hydrogen has been reported by D. M. Gruen, S. Liu, A. R. Krauss and X. Pan, *J. Appl. Phys.*, 75, 1758–1763 (1994), and D. M. Gruen, S. Liu, A. R. Krauss, J. Luo and X. Pan, *Appl. Phys. Lett.*, 64, 1502–1504 (1994).

Recently, dispersed diamond particles with diameters in the range of 20–150Å have been observed in fullerene-rich soot as disclosed by Vladimir Kuznetsov, A. L. Chuvilin, E. M. Moroz, V. N. Kolomiichuk, Sh. K. Shaikhutdinov, Yu. V. Butenko, *Carbon*, 32, 873–882 (1994), and Vladimir L. Kuznetsov, Andrey L. Chuvilin, Yuri V. Butenko, Igor Yu. Malkov, Vladimir M. Titov, *Chem. Phys. Lett.*, 222, 343–348 (1994). It would be very advantageous and of potentially significant commercial value to be able to grow diamond particles with much larger particle sizes.

SUMMARY OF THE INVENTION

It is an object of the present invention to provide an economical process for growing diamonds which does not require high temperatures or pressures.

The present invention provides a process for the formation of diamond particles of mean diameters in excess of 10 µm, grown from diamond powder nucleation seeds of approximately 1.5 µm mean diameter. $C_{70}$ is reduced in the presence of reducing or reacting agents such as selenium or phosphorous at moderate temperatures and pressure.

In one aspect of the invention there is provided a process for growing diamonds. The method comprises reducing a quantity of $C_{70}$ in the presence of diamond seed particles to cause at least some of the diamond seed particles to grow.

In another aspect of the invention, a process for growing diamonds is provided which comprises providing diamond seed particles, and providing a quantity of $C_{70}$ powder and a reducing or reacting agent both in flow communication with the diamond powder. The process includes heating the $C_{70}$, the reducing agent and the diamond powder under vacuum at an effective temperature and for an effective period of time to cause some of the $C_{70}$ to be reduced by the reducing agent and deposit onto at least some of the diamond seed particles causing the particles to grow larger.

In this aspect of the invention the preferred reducing agent is selenium or phosphorous, the effective temperature is about 550° C. and the effective period of time is from about 18 days to about 60 days.

In another aspect of the invention there is provided a process for growing diamonds. The process comprises providing a plurality of diamond seed particles having a mean diameter and providing a quantity of $C_{70}$ powder and a reducing agent. The $C_{70}$ powder and the reducing agent are in flow communication with the diamond seed particles. The process includes the step of heating the $C_{70}$ powder to produce $C_{70}$ in the vapour phase, and heating the reducing agent and the diamond seed particles under vacuum at a temperature of from about 500° C. to about 600° C. and for a period of time of from about 18 days to about 60 days to cause a portion of the $C^{70}$ in the vapour phase to be reduced by the reducing agent and deposit onto and increase the mean diameter of at least one of the diamond seed particles.

BRIEF DESCRIPTION OF THE DRAWINGS

The method of diamond growth from $C_{70}$ forming the subject invention will now be described, reference being had to the accompanying drawings, in which.

DETAILED DESCRIPTION OF THE INVENTION

Figure 1:
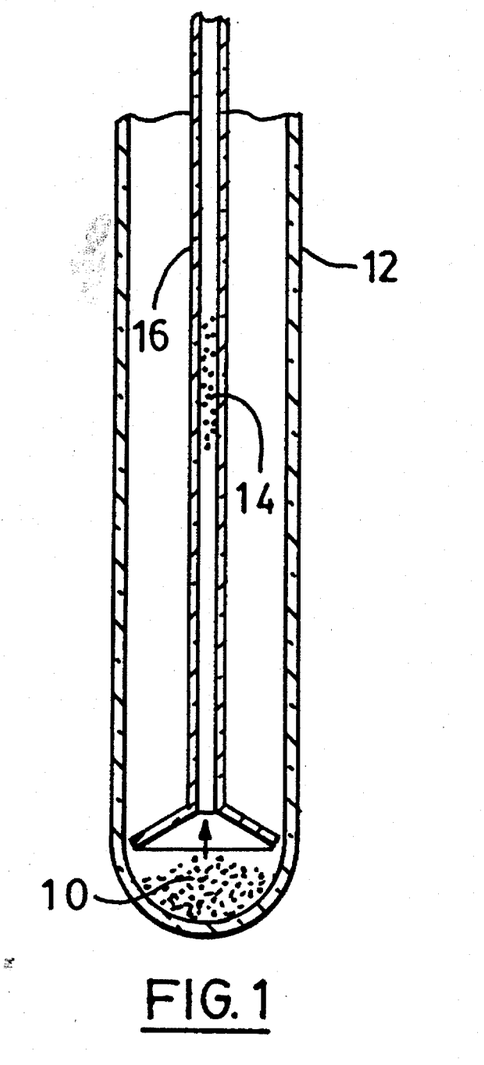
FIG. 1 illustrates an apparatus used for growing diamonds from diamond seeds according to the present invention.

Referring to FIG. 1, approximately 18 to 20 mg of $C_{70}$ (98%), approximately 11 mg of elemental selenium powder (99.5%, −325 Mesh particle size, Alfa) or red phosphorous powder (99%, −100 Mesh particle size, Alfa) and trace quantities of diamond seed powder (average diameter of 1.5 μm) were placed generally at 10 in a 1 cm diameter×10 cm long pyrex tube 12. A trace quantity (<1 mg) of diamond powder shown generally at 14 was loaded into a small pyrex capillary (1.0 mm×50 mm) 16, which was then set into the larger pyrex tube 12 as shown in FIG. 1. The entire tube assembly was evacuated and sealed under vacuum (~2×10$^{-5}$ torr). After heating the tube assembly at a temperature of about 550° C. in a tube oven (not shown) with controllable temperature for 20 to 30 days, various portions of the product were examined using laser micro-Raman Spectroscopy and scanning electron microscopy (SEM).

Crystallite sizes and shapes of the diamond seeds and the reaction produces were examined using scanning electron microscopy (HITACHI model S-570, Japan). The identification of the crystallites as diamond was accomplished using Laser micro-Raman spectroscopy. An important advantage of micro-Raman spectroscopy is that the sample crystallite can be located by a charge coupled device (CCD) camera at high magnification. This enabled both the size of the crystallite and its identity to be determined simultaneously. A Kr ion laser tuned to 530.87 nm was used as the excitation source. An approximately 2 mW beam was focused down to a 3 micrometer diameter spot. Raman spectra were detected in a back scattering geometry using a triplemate spectrometer (SPEX Industries Inc. model 1877D) equipped with a microscope (Micromate model 1482D) and a liquid nitrogen cooled CCD detector (Princeton Instruments Inc. Model LN/CCD).

Figure 2:
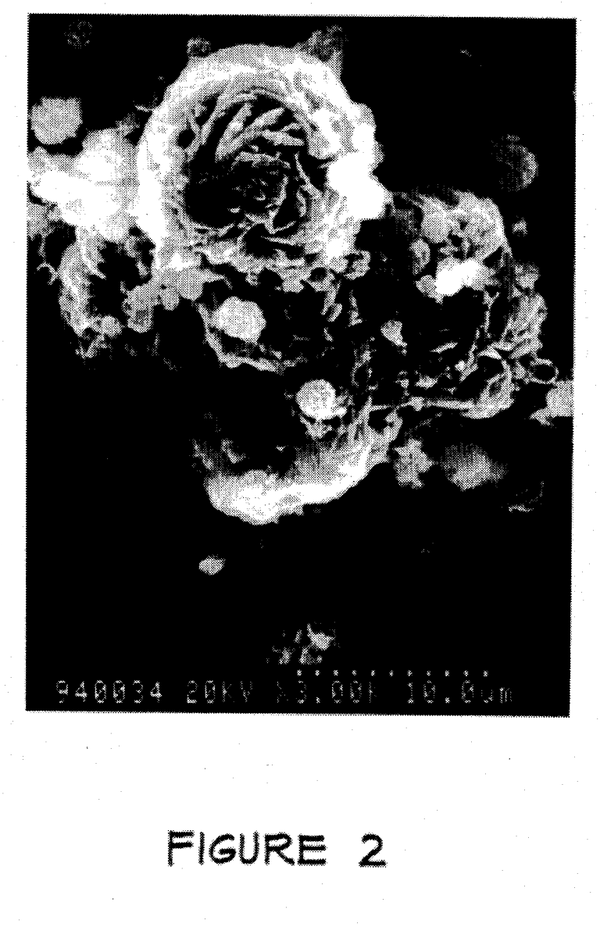
FIG. 2 is an SEM micrograph of $C_{70}$ polycrystalline powder used in the method according to the present invention.
Figure 3:
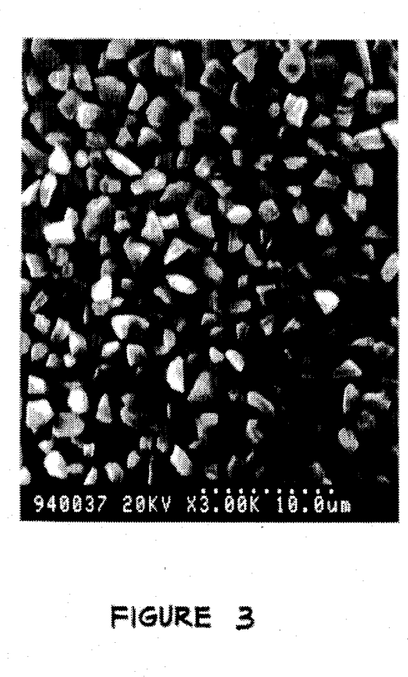
FIG. 3 is an SEM micrograph of a sample of the diamond seeds (average size ~1.5 μm) used in the method of the present invention.
Figure 4:
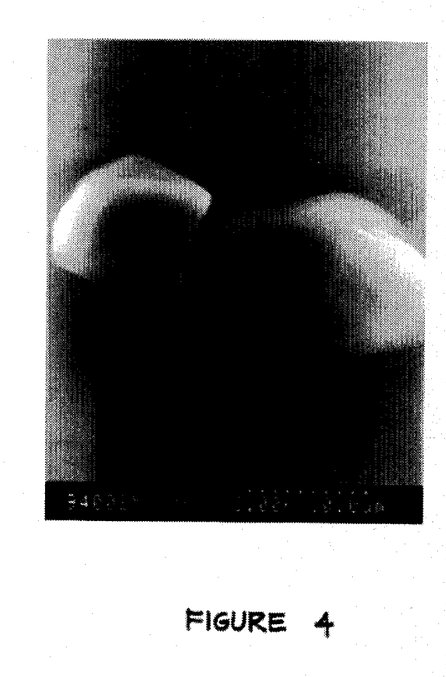
FIG. 4 is a scanning electron micrograph (SEM) of two diamond particles found in the lower portion of the capillary shown in FIG. 1 after the assembly was heated at 550° C. for 20 days in the presence of selenium.

An SEM image of the $C_{70}$ powder that was used in the above-described experiment is shown in FIG. 2. The plate-like crystallites are shown for the purpose of comparison with diamond crystallites. FIG. 3 shows an SEM image of a sample of the diamond powder that was used as seed diamond. Examination of several such samples showed that particle diameters rarely exceeded 2 μm and no particle with a diameter in excess of 3 μm was seen. In contrast, FIG. 4 shows two crystallites with average diameters, respectively, of approximately 8 μm and 17 μm that were found among the reaction products of the fullerene seeded with small diamond particles and with selenium used as the reducing or reacting agent after 20 days of heating at 550° C. Only approximately 1% of the diamond seeds were found to be enlarged to this extent. However, on a volume basis the overall enlargement of the seeds was substantial.

Figure 5:
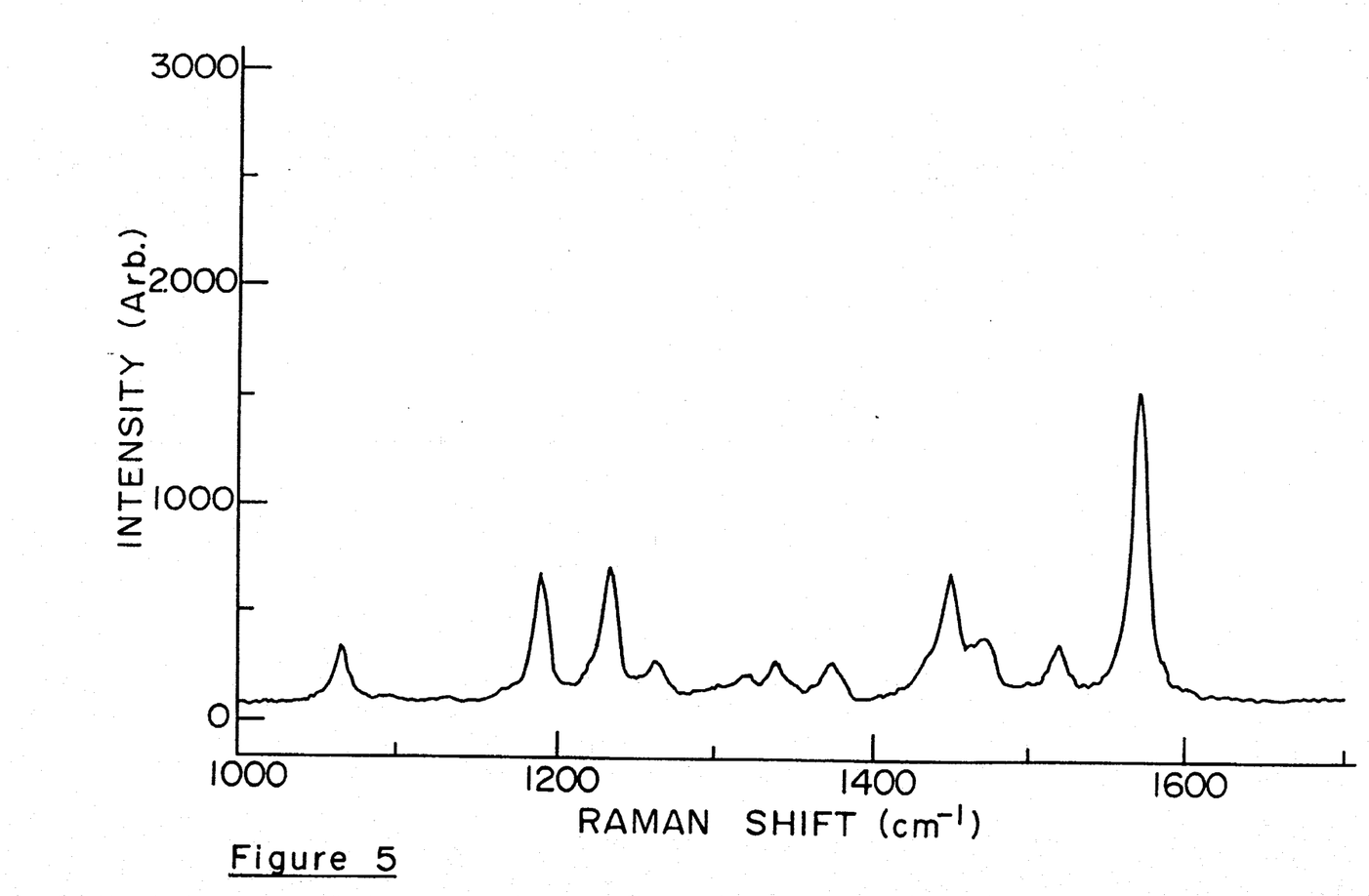
FIG. 5 displays a typical laser micro-Raman spectrum of the $C_{70}$ polycrystalline powder of FIG. 2.
Figure 6:
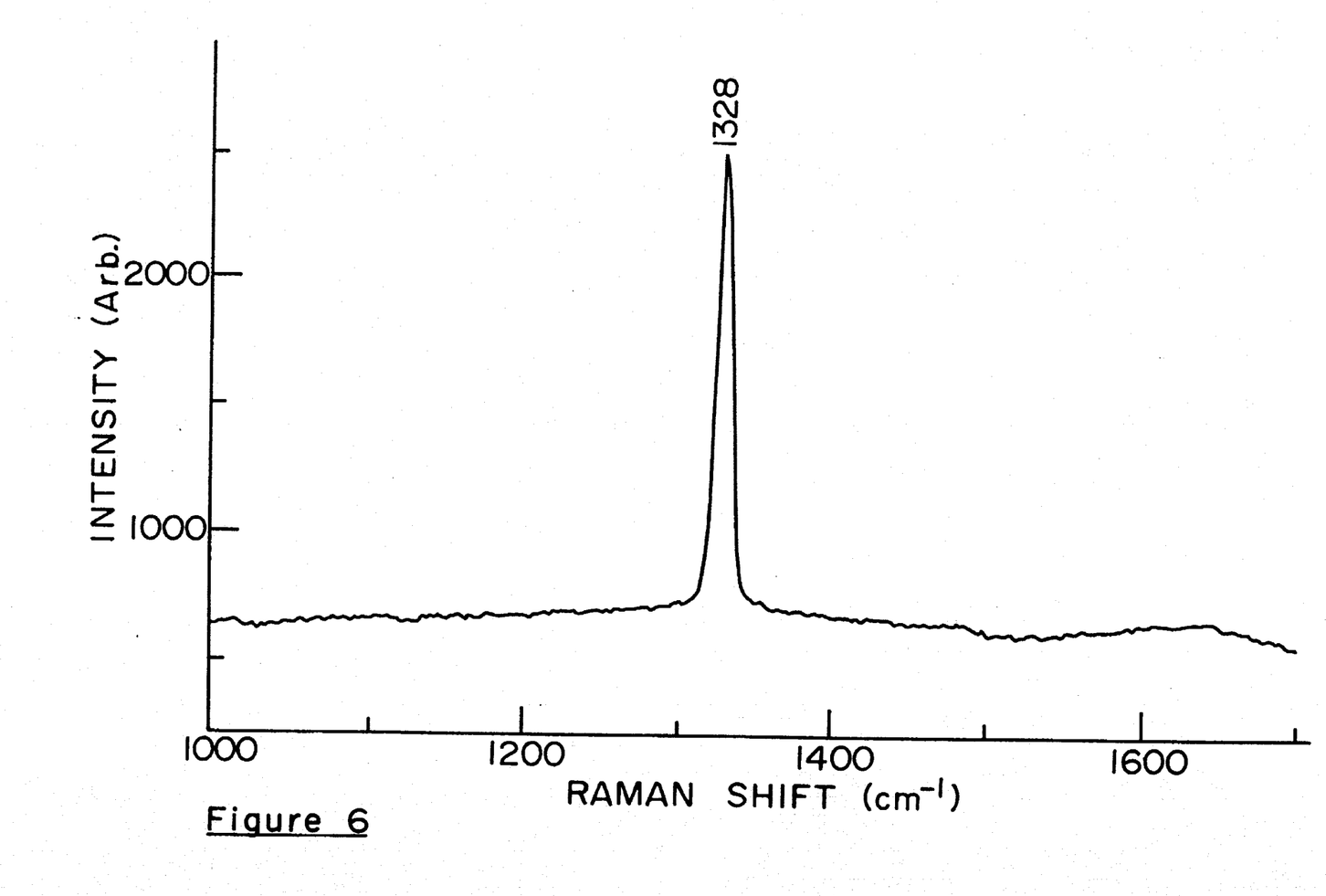
FIG. 6 displays a laser micro-Raman spectrum of one of the particles shown in FIG. 4.

The micro-Raman spectrum of one of these crystallites is shown in FIG. 6. The characteristic single peak at approximately 1328 cm$^{-1}$ is unequivocal proof that the particle is diamond. For comparison, the Raman spectrum of $C_{70}$ that was used in this work is shown in FIG. 5. There is no such peak at 1328 cm$^{-1}$. The 26 relatively strong vibrational mode frequencies obtained from the spectrum of FIG. 5 are in good agreement with values previously disclosed in R.-A. Jishi, M. S. Dresselhaus, G. Dresselhaus, Kai-An Wang, Ping Zhou, A. M. Rao and P. C. Eklund, *Chem. Phys. Lett.*, 206, 187 (1993). These vibrational mode frequencies are also in good agreement with group theoretical analysis, see M. S. Dresselhaus, G. Dresselhaus and R. Saito, *Phys. Rev. B*, 45, 6234 (1992). In all $C_{70}$ has 53 Raman active modes.

Most of the larger diamond particles that were produced were found in the capillary 16 (FIG. 1) in which the seed diamonds were deposited. This strongly suggests that gas-phase $C_{70}$ was responsible for the growth of the seed diamonds. $C_{70}$ has a substantial vapour pressure at 550° C. The Raman spectrum of the material that remained at the bottom of the larger tube 10 after 20 days corresponded to that of unreacted $C_{70}$.

Analogous experiments were also conducted using $C_{60}$ instead of $C_{70}$. These experiments using $C_{60}$ did not produce any measurable growth in the size of the diamond seed particles based on comparison of SEMs taken before and after prolonged exposure of the seeds to $C_{60}$ under essentially the same conditions of temperature, pressure and time as with the $C_{70}$.

In addition to selenium and phosphorous, other elemental reducing agents such as sodium, potassium and sulphur are contemplated by the inventors to be effective in reducing $C_{70}$ and at temperatures higher than in the range 500° to 600° C.

Figure 7:
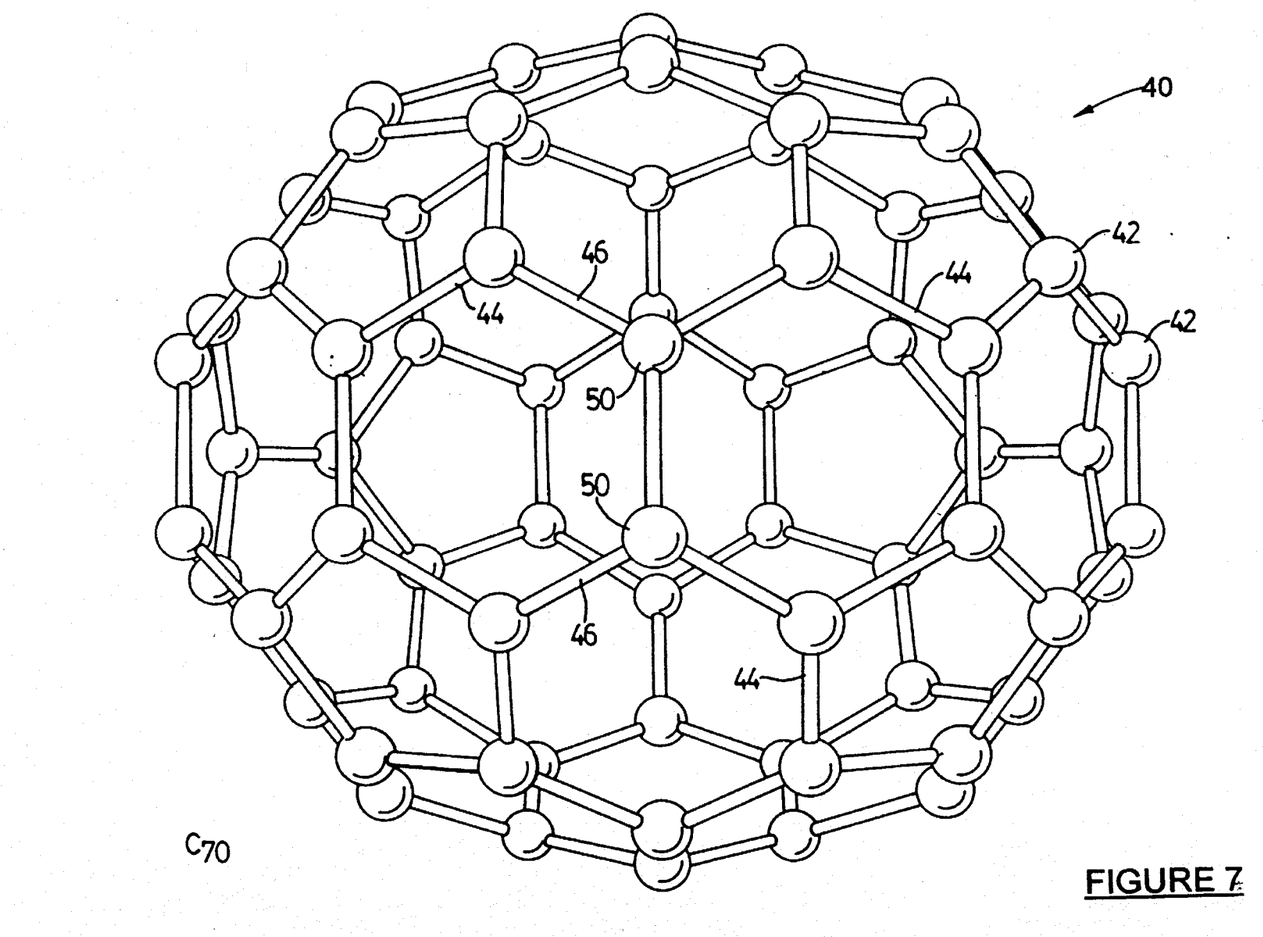
FIG. 7 shows the structure of $C_{70}$.
Figure 8:
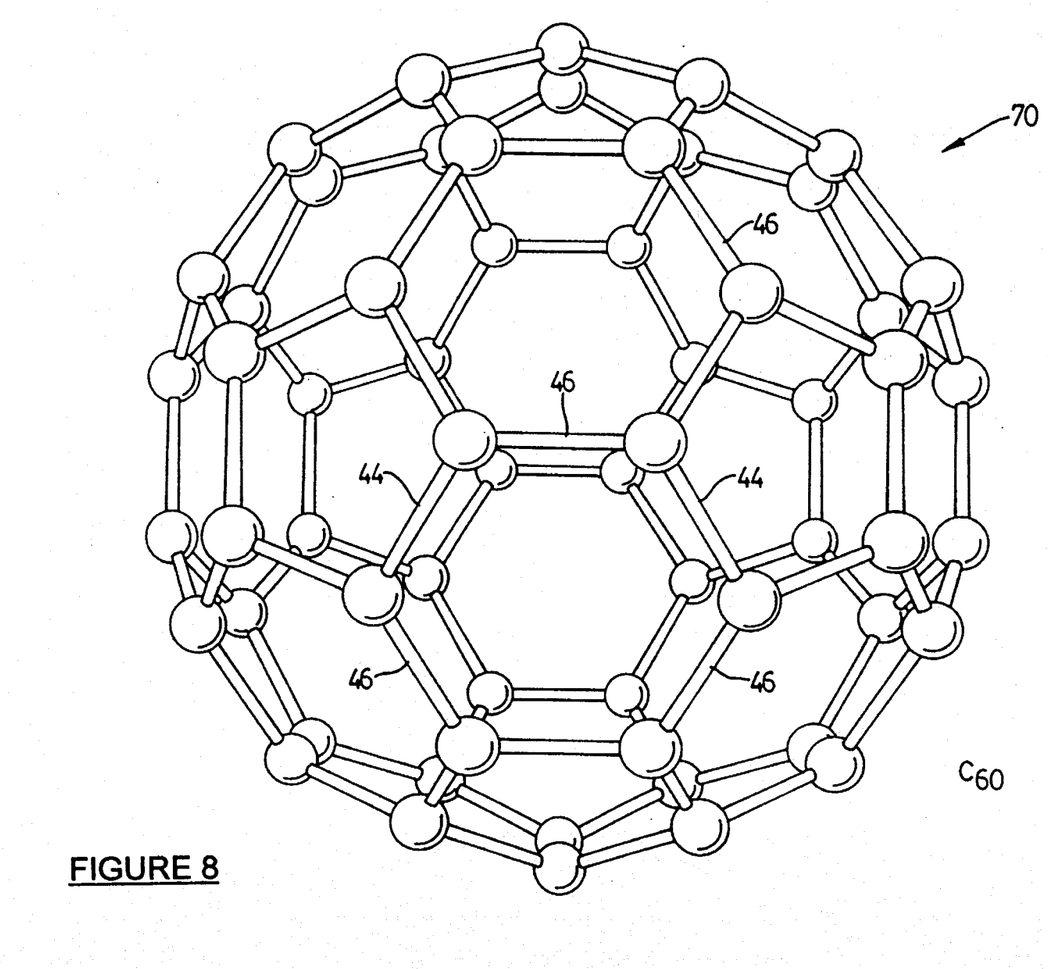
FIG. 8 shows the structure of $C_{60}$.

The following is a possible growth mechanism proposed by the inventors. The mechanism is speculative, so it will be understood that the following is meant to be a non-limiting explanation. The structure of $C_{70}$ is shown generally at 40 in FIG. 7 and can be compared to the structure of $C_{60}$ shown at 70 in FIG. 8. The carbon atoms 42 comprising $C_{70}$ are hybridized intermediately between sp$^2$ (as in graphite) and sp$^3$, the hybridization of carbon in diamond. When one of the bonds is broken in a fullerene, the two carbons comprising the broken bond have a choice between sp$^2$ and sp$^3$ hybridization according to the nature of the reaction partner that reacts at the broken bond. Referring to FIG. 8, $C_{60}$ has two types of C—C bonds; a so-called "single bond" 44 at the edges between pentagonal and hexagonal faces, and "double bond" 46 at the edges between hexagonal faces. However, all carbon atoms are vertices of both hexagonal and pentagonal faces. Referring to FIG. 7, $C_{70}$ has, additionally, C—C bonds 50 that are edges separating two hexagonal faces and, also, vertices of hexagonal faces only. The inventors speculate that it is these additional carbon-carbon bonds 50 in $C_{70}$ that break to initiate diamond growth.

It is speculated that the diamond seed acts as a template whose surface dangling bonds ensure that the carbon atoms of the newly ruptured C—C bond of the $C_{70}$ molecule adopt the sp$^3$ hybridization required to continue the diamond growth. Ultimately all of the carbon atoms of the $C_{70}$ molecule could be incorporated into the diamond.

Although the process in accordance with the present invention occurs at relatively low temperatures and pressures, it makes use of the free energy stored in the $C_{70}$ molecule during its formation at the very high temperatures of the carbon arc used to generate it. This increase in free energy (over that of the graphite precursor in the form of the electrodes of the arc) manifests itself in the intermediate hybridization characteristic of the fullerenes. Recent theory predicts the involvement of a non-planar intermediate which has one $sp^3$ and one sp hybridized carbon, see Robert L. Murray, Douglas L. Strout, Gregory K. Odom and Gustavo E. Scuseria, *Nature*, 366, 665–667 (1993).

In order to channel this free energy into diamond formation some of the C—C bonds in $C_{70}$ must be induce to rupture. This is achieved by the presence of materials such as selenium or phosphorous that donate electrons to the $C_{70}$ and, therefore, facilitate bond breaking.

The present invention advantageously provides an economical method of growing diamonds from seed diamond particles with $C_{70}$ which does not require high pressures or temperatures as in the known methods. The result that $C_{70}$, but not $C_{60}$, can be readily reduced in the presence of a reducing agent was completely unexpected. While the process has been described with respect to the preferred process, those skilled in the art will appreciate that numerous variations of this process may be made to grow diamonds which still fall within the ambit of the following claims.

Therefore what is claimed is:

1. A process for growing diamonds, comprising;
  exposing diamond seed particles to vapour phase $C_{70}$ in the presence of an element selected from the group consisting of selenium and phosphorous at an effective pressure and effective temperature to cause at least some of the diamond seed particles to grow.

2. The process according to claim 1 wherein the effective temperature is about 550° C.

3. A process for growing diamonds, comprising:
  providing a plurality of diamond seed particles;
  providing a quantity of $C_{70}$ powder and an element selected from the group consisting of selenium and phosphorous, said $C_{70}$ powder and said element being in flow communication with said diamond seed particles; and
  heating said $C_{70}$ powder to produce $C_{70}$ powder in vapour phase, and heating said element and said diamond seed particles at an effective pressure and effective temperature and for an effective period of time to cause at least some of said diamond seed particles to grow.

4. The process according to claim 3 wherein said effective temperature is a temperature greater than about 500° C.

5. The process according to claim 3 wherein said effective temperature is in the range from about 500° C. to about 600° C. and said effective period of time is from about 18 days to about 60 days.

6. The process according to claim 5 wherein said effective pressure is below about $2\times10^{-5}$ torr.

7. A process for growing diamonds, comprising:
  providing a plurality of diamond seed particles each having a volume;
  providing a quantity of $C_{70}$ powder and a reacting agent said $C_{70}$ powder and said reacting agent being in flow communication with said diamond seed particles; and
  heating said $C_{70}$ powder to produce $C_{70}$ in the vapour phase, and heating said reacting agent and said diamond seed particles under vacuum at a temperature of from about 500° C. to about 600° C. and for a period of time from about 18 days to about 60 days to cause an increase in the volume of at least some of said diamond seed particles.

8. The process according to claim 7 wherein the step of providing a plurality of diamond seed particles comprises providing diamond seed particles having a mean diameter of about 1.5 microns.

9. The process according to claim 8 wherein the step of heating comprises increasing the mean diameter of said diamond seed particles to at least 10 microns.

10. The process according to claim 9 wherein said reacting agent is selected from the group consisting of selenium and phosphorous.

11. The process according to claim 9 wherein said reacting agent is selected from the group consisting of sodium, potassium and sulphur.

12. The process according to claim 10 wherein said temperature is about 550° C.

13. A process for growing diamonds, comprising;
  exposing diamond seed particles to vapour phase $C_{70}$ in the presence of sulphur at an effective pressure and effective temperature to cause at least some of the diamond seed particles to grow.

* * * * *